(12) United States Patent
Chang et al.

(10) Patent No.: US 8,072,818 B2
(45) Date of Patent: Dec. 6, 2011

(54) DUAL-THRESHOLD-VOLTAGE TWO-PORT SUB-THRESHOLD SRAM CELL APPARATUS

(75) Inventors: Mu-Tien Chang, Taipei (TW); Po-Tsang Huang, Hsinchu (TW); Wei Hwang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 32 days.

(21) Appl. No.: 12/654,730

(22) Filed: Dec. 30, 2009

(65) Prior Publication Data

US 2010/0172194 A1   Jul. 8, 2010

(30) Foreign Application Priority Data

Jan. 7, 2009 (TW) .............................. 98100288 A

(51) Int. Cl.
*G11C 7/00* (2006.01)
*G11C 8/16* (2006.01)
(52) U.S. Cl. ............. 365/189.011; 365/230.05; 365/154

(58) Field of Classification Search .................. None
See application file for complete search history.

(56) References Cited

U.S. PATENT DOCUMENTS

| 6,307,805 | B1 * | 10/2001 | Andersen et al. | ......... 365/230.06 |
| 6,519,176 | B1 * | 2/2003 | Hamzaoglu et al. | .......... 365/154 |
| 7,672,152 | B1 * | 3/2010 | Kulkarni et al. | .............. 365/154 |
| 2009/0175068 | A1 * | 7/2009 | Ouyang et al. | ................ 365/154 |

* cited by examiner

*Primary Examiner* — Hoai V Ho
*Assistant Examiner* — James G Norman
(74) *Attorney, Agent, or Firm* — Bacon & Thomas, PLLC

(57) ABSTRACT

The invention relates to a dual-threshold-voltage two-port sub-threshold SRAM cell apparatus. The above-mentioned apparatus comprises a first inverter, a second inverter, an access transistor and a read buffer. The first inverter and the second inverter include a plurality of first operating elements and a plurality of second operating elements for storing data. The access transistor is coupled to the first inverter and the second inverter, wherein the first operating elements and the second operating elements are high threshold voltage operating elements and the access transistor is low threshold voltage operating transistor. The read buffer is used for performing a read operation.

2 Claims, 1 Drawing Sheet

DUAL-THRESHOLD-VOLTAGE TWO-PORT SUB-THRESHOLD SRAM CELL APPARATUS

BACKGROUND OF THE INVENTION

1. Field of the Invention

The invention relates to a SRAM cell apparatus, particularly to a dual-threshold-voltage two-port sub-threshold SRAM cell apparatus.

2. Description of the Prior Art

The Static Random Access Memory (SRAM) is a kind of Random Access Memory (RAM). It means if the electric power is kept in the SRAM, the data will be able to be stored in it constantly. On the contrary, the data stored in the Dynamic Random Access Memory (DRAM) has to be upgraded periodically, and when the power supply is cut off, the stored data will be disappeared, which is completely different from the Read-Only Memory (ROM) or flash memory.

Thus, in the semiconductor memory devices, compared with the above-mentioned DRAM, the SRAM can provide the advantage of lower power consumption, and faster operation speed. Therefore, the SRAM can be widely used as the flash memory in the computer or in the other portable devices.

In the prior art, generally the SRAM often contains a wordline driver for receiving a word selection signal from an encoder. The wordline driver usually contains the inverters which are composed of the elements with smaller channel length and wider width. These inverters are used to adjust the voltage level on the wordline upon write program and read data. The inverter usually contains a pair of P-type Metal Oxide Semiconductor (PMOS) transistor and N-type Metal Oxide Semiconductor (NMOS) transistor. These two transistors are connected by a complementary power supply in serial, in order to generate a reverse signal corresponding to an input signal. The above-mentioned SRAM is widely applied in various single chip systems at present.

Although single chip systems can be used in many specific fields, such as the biomedical and electronic fields etc., but the single chip system stress has to have the characteristics of high reliability, low-voltage operation, low power consumption, and good stability etc. Thus, the design of SRAM is still unable to meet the above-mentioned requirements in the industry at present.

Therefore, in order to respond the technology demand for the production of SRAM, it is necessary to develop relevant process and technology to reduce the cost of operation manpower and manufacturing time, and reach the goal of energy conservation and carbon reduction effectively.

SUMMARY OF THE INVENTION

The invention provides a dual-threshold-voltage two-port sub-threshold SRAM cell apparatus to improve the drawback of the existing technology.

The invention relates to a dual-threshold-voltage two-port sub-threshold SRAM cell apparatus, the dual-threshold-voltage two-port sub-threshold SRAM cell apparatus comprises a first inverter, a second inverter, an access transistor and a read buffer. It can be operated at low voltage near threshold voltage. The first inverter includes a plurality of first operating elements. The second inverter is coupled to the first inverter and includes a plurality of second operating elements. The access transistor is coupled to the first inverter and the second inverter, wherein the first operating elements and the second operating elements have the first threshold voltage, and the access transistor has the second threshold voltage. The first threshold voltage is higher than the second threshold voltage. In addition, the first operating elements and the second operating elements are high threshold voltage operating elements and the access transistor is low threshold voltage operating transistor.

The dual-threshold-voltage two-port sub-threshold SRAM cell apparatus provided by the invention is suitably to be applied at the sub-threshold voltage. Even the stability of memory cell is decreased at lower voltage, the dual-threshold-voltage and two-port sub-threshold SRAM cell apparatus provided by the invention still can be operated stably at the sub-threshold voltage.

In addition, the invention utilizes the Dual-Vt scheme to reach the higher stability. The invention adopts the High-Vt device to hold stability and reduce the leakage current for the inverter used to store the data. Meantime, due to the de-couple of the data storage node and the bitline, the read stability will be increased significantly.

The invention adopts the Low-Vt device at the write-port to increase the write ability. Thus the structure of the invention is single-end read and single-end write, which can reduce the power consumption caused by the excess bitline. As for the design of the write-port, the read buffer is used to isolate the write bitline and the data storage inverter, in order to increase the read stability of the data.

Therefore, the advantage and spirit of the invention can be understood further by the following detail description of invention and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
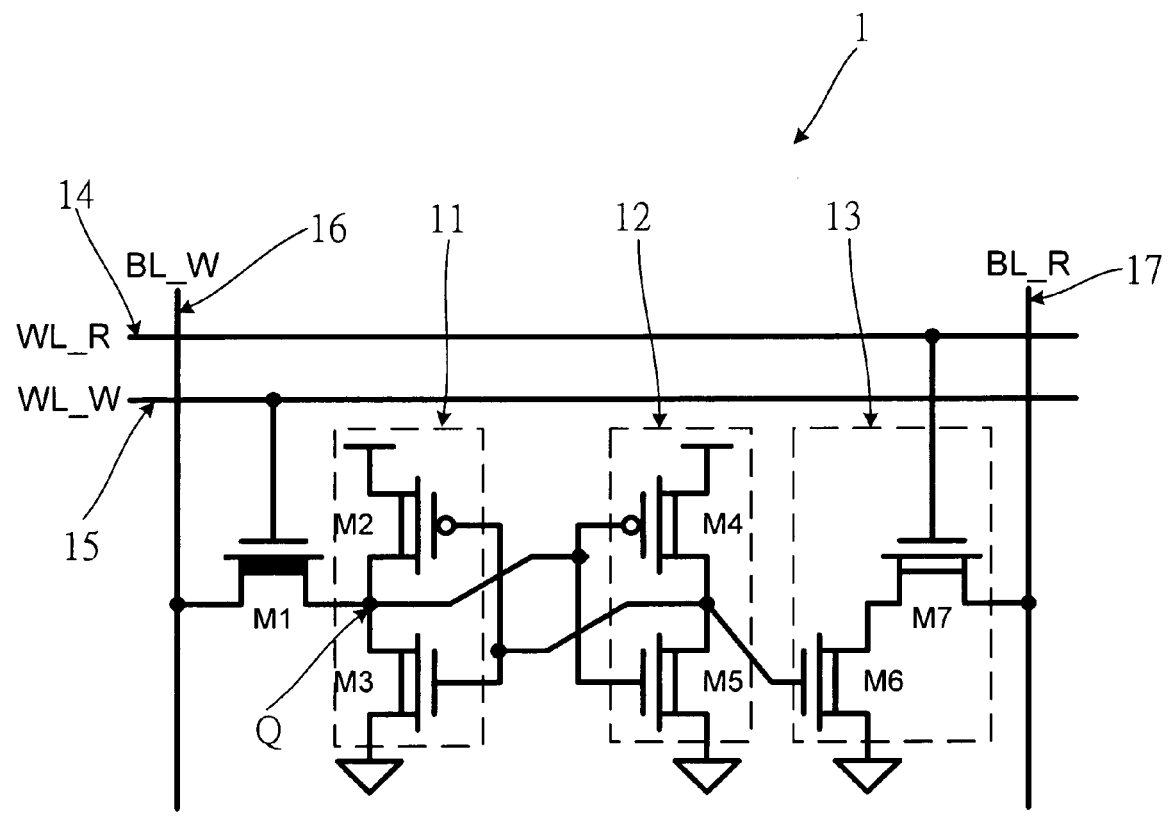
FIG. 1 is a graph illustrating the circuit of the dual-threshold-voltage two-port sub-threshold SRAM cell apparatus according to an embodiment of the invention.

FIG. 1 is a graph for illustrating the circuit of the dual-threshold-voltage two-port sub-threshold SRAM cell apparatus according to an embodiment of the invention. The dual-threshold-voltage two-port sub-threshold SRAM cell apparatus 1 provided by the embodiment includes a first inverter 11, a second inverter 12, a read buffer 13, an access transistor M1, a read wordline 14, a write wordline 15, a write bitline 16, and a read bitline 17.

The dual-threshold-voltage two-port sub-threshold SRAM cell apparatus 1 provided by the embodiment adopts single-end read and single-end write structure to reduce the number of bitline, so as to reduce the power consumption caused by the excess bitline.

The above-mentioned first inverter 11 includes a plurality of the first operating elements M2 and the first operating elements M3. The second inverter 12 includes a plurality of second operating elements M4 and second operating elements M5. The read buffer 13 includes the third operating element M7 and the fourth operating element M6.

In the embodiment, the output end of the first inverter 11 is coupled to the input end of the second inverter 12, and the output end of the second inverter 12 is coupled to the input end of the first inverter 11, in order to form a latch for storing data.

The above-mentioned first operating element M2 of the first inverter 11 and the second operating element M4 of the second inverter 12 are the pull-up elements. The first operating element M3 of the first inverter 11 and the second operating element M5 of the second inverter 12 are the pull-down elements. In the embodiment, the pull-up elements of the first operating element M2 and the second operating element M4 are PMOS transistors. The pull-down elements of the first operating element M3 and the second operating element M5 are NMOS transistors. One end of the first operating element M2 and the second operating element M4 are coupled to a Vdd power supply, respectively. One end of the first operating element M3 and the second operating element M5 are coupled to a Vcc power supply, respectively.

The above-mentioned access transistor M1 is coupled to the first inverter 11, the second inverter 12, the write wordline 15 and the write bitline 16. In the embodiment, the operation of access transistor M1 is controlled by the signal of write wordline 15. In the embodiment, the access transistor M1 is an NMOS. It has to mention that the first operating elements M2, the first operating elements M3 and the second operating elements M4, the second operating elements M5 have the first threshold voltage, and the access transistor M1 has the second threshold voltage. The first threshold voltage is higher than the second threshold voltage. It means the first operating elements M2, the first operating elements M3 and the second operating elements M4, the second operating elements M5 are the high threshold voltage operating elements and the access transistor M1 is low threshold voltage operating transistor.

In the embodiment, under the data holding state, the first operating elements M2, the first operating elements M3 and the second operating elements M4, the second operating elements M5 are used for data storage inverter to increase the data hold stability and reduce the leakage current. The stored data will not be changed due to noise, thus the stability of data is increased.

In the embodiment, under the write state, the application of Low-Vt device on the access transistor M1 can increase the write ability, namely can mitigate the data write problem caused by the partial voltage effect (partial voltage between the access transistor M1 and the second operating element M3), so as to increase the write ability. Thus the access transistor M1 has low threshold voltage to help the write state.

The read buffer 13 is used to execute a read operation. The read buffer 13 is coupled to the first inverter 11, the second inverter 12, the read wordline 14 and the read bitline 17. In addition, the third operating element M7 is coupled to the fourth operating element M6, the read wordline 14 and the read bitline 17. The fourth operating element M6 is coupled to the third operating element M7 and the second inverter 12. In the embodiment, the operation of read buffer 13 is controlled by the signal of read wordline 14, thus it can be operated at low voltage near the threshold voltage. The read buffer can isolate the latch and the read bitline, in order to prevent the noise of read bitline entering the latch, so as to increase the stability of the latch upon reading.

In the embodiment, the third operating element M7 and the fourth operating element M6 are the NMOS transistors. The third operating element M7 and the fourth operating element M6 have the third threshold voltage, and the third threshold voltage is higher than the second threshold voltage. In the embodiment, it means the third operating element M7 and the fourth operating element M6 are high threshold voltage operating elements. Thus M2 to M7 have high threshold voltage, which can be used to reduce power consumption and leakage current.

The dual-threshold-voltage two-port sub-threshold SRAM cell apparatus 1 provided by the embodiment utilizes the Dual-Vt element, de-couple of data storage node Q and bitline to reach the higher stability of the read and the write. Under de-couple of data storage node and bitline, the data storage node Q is not disturbed by the signal of bitline, so as to increase the anti-noise ability upon the read state.

Summarized from the above description, the dual-threshold-voltage and two-port sub-threshold SRAM cell apparatus provided by the invention is suitably to be applied at the sub-threshold voltage. Even the stability of memory cell is decreased at lower voltage, the dual-threshold-voltage and two-port sub-threshold SRAM cell apparatus provided by the invention still can be operated stably at the sub-threshold voltage. The structure of the invention is single-end read and single-end write can reduce the power consumption caused by long bitline, thus it is very suitable for the design of long term activation FIFO memory.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains

What is claimed is:

1. A dual-threshold-voltage two-port sub-threshold SRAM cell apparatus, comprising:

a first inverter having a plurality of first operating elements, wherein the plurality of first operating elements have a first threshold voltage;

a second inverter having a plurality of second operating elements, wherein the plurality of second operating elements have the first threshold voltage, and the second inverter is coupled to the first inverter;

an access transistor having a second threshold voltage, wherein the access transistor is coupled to the first inverter, the second inverter, a write wordline and a write bitline; and a read buffer for performing a cell read operation, wherein the read buffer is coupled to the first inverter, the second inverter, a read wordline and a read bitline, comprising:

a third operating element having a third threshold voltage, wherein the third operating element is coupled to the read wordline and the read bitline; and a fourth operating element having the third threshold voltage, wherein the fourth operating element is coupled to the second inverter and the third operating element, and the third threshold voltage is higher than the second threshold voltage; wherein the first threshold voltage is higher than the second threshold voltage.

2. The apparatus according to claim 1, wherein the third operating element and the fourth operating element both are the NMOS transistors.

* * * * *